United States Patent
Enomoto et al.

(10) Patent No.: US 6,495,305 B1
(45) Date of Patent: Dec. 17, 2002

(54) HALOGENATED ANTI-REFLECTIVE COATINGS

(76) Inventors: Tomoyuki Enomoto, 1-22-33, Kamijujo, Kita-Ku, Tokyo 114-0034 (JP); Ken-Ichi Mizusawa, 1-2-3 Sodegaura, Narashino-shi, Chiba (JP); Shin-Ya Arase, 1692-48 Toke-cho, Midori-ku, Chiba-shi, Chiba (JP); Rama Puligadda, 210 Becca Dr., Rolla, MO (US) 65401

( * ) Notice: Subject to any disclaimer, the term of this patent is extended or adjusted under 35 U.S.C. 154(b) by 0 days.

(21) Appl. No.: 09/679,661

(22) Filed: Oct. 4, 2000

(51) Int. Cl.⁷ .................................. G03F 7/004
(52) U.S. Cl. ................. 430/270.1; 430/271.1; 430/907
(58) Field of Search ............ 430/270.1, 271.1, 430/907

(56) References Cited

U.S. PATENT DOCUMENTS

| | | | |
|---|---|---|---|
| 5,886,102 A | | 3/1999 | Sinta et al. ........... 525/154 |
| 5,919,555 A | * | 7/1999 | Yasuda et al. ......... 428/206 |
| 5,919,599 A | | 7/1999 | Meador et al. ......... 430/271.1 |

FOREIGN PATENT DOCUMENTS

| | | | |
|---|---|---|---|
| DE | 2541527 | * | 3/1976 |
| JP | 58093003 | * | 6/1983 |
| JP | 62156105 | * | 7/1987 |
| JP | 04363370 | * | 12/1992 |
| JP | 05150197 | * | 6/1993 |

OTHER PUBLICATIONS

CAplus 108:22511 abstract of JP 62156105, Jul. 1987.*
CAplus 100:8399 abstract of JP 58093003, Jun. 1983.*
CAplus 114:214507 abstract of JP 02249541, Oct. 1990.*
CAplus 119:10517 abstract of JP 04363370, Dec. 1992.*
CAplus 85:22274 abstract of DE 2541527, Mar. 1976.*
CAplus 119:210784 abstract of JP 05150197.*
Macromolecules, 1994, 27(23), 6736–9.*
G.N. Taylor et al., "Oxygen Plasma Removal of Thin Polymer Films," *Polymer Engineering and Science*, Mid-–Nov., vol. 20, No. 16, 1980.

* cited by examiner

*Primary Examiner*—Rosemary Ashton
(74) *Attorney, Agent, or Firm*—Hovey Williams LLP

(57) ABSTRACT

Anti-reflective coatings formed from new polymers and having high etch rates are provided. Broadly, the coatings are formed from a polymer binder and a light attenuating compound. The polymer binder has halogen atoms bonded thereto, preferably to functional groups on the polymer binder rather than to the polymer backbone. Preferred polymer binders comprise acrylic polymers while it is preferred that the halogenated functional groups of the polymer binders be dihalogenated, and more preferably trihalogenated, with chlorine, fluorine, or bromine atoms.

44 Claims, No Drawings

HALOGENATED ANTI-REFLECTIVE COATINGS

BACKGROUND OF THE INVENTION

1. Field of the Invention

The present invention is broadly concerned with new halogenated polymers which can be used as polymer binders in anti-reflective coatings, the resulting anti-reflective coatings, and methods of use thereof. More particularly, the inventive anti-reflective coatings comprise a polymer binder and a light attenuating compound wherein the polymer binder is halogenated, preferably on functional groups of the polymer binder. The coatings have high etch rates as well as good light-absorbing properties.

2. Description of the Prior Art

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) microlithographic processes.

However, a frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the use of an anti-reflective coating (ARC) applied to the substrate beneath the photoresist layer.

Compositions which have high optical density at the typical exposure wavelengths have been used for some time to form these ARC layers. The ARC compositions typically consist of an organic polymer which provides coating properties and a dye for absorbing light. The dye is either blended into the composition or chemically bonded to the polymer. Thermosetting ARCs contain a cross-linking agent in addition to the polymer and dye. Cross-linking must be initiated, and this is typically accomplished by an acid catalyst present in the composition.

While these ARCs are effective at lessening the amount of light reflected back into the photoresist, most prior art ARC compositions are lacking in that they do not have a sufficiently high etch rate. As a result, prior art ARCs present significant limitations which make them difficult or impossible to use on submicron (e.g., 0.3 μm) features. Accordingly, there is a need for faster etching ARCs which can be effectively utilized to form integrated circuits having submicron features.

SUMMARY OF THE INVENTION

The instant invention overcomes these problems by providing new halogenated compounds and polymers which can be used to form anti-reflective coatings (ARC) having substantially improved etch rates when compared to prior art ARCs. The instant invention also provides methods of using the inventive ARCs in the integrated circuit manufacturing process.

In more detail, the inventive ARCs comprise a polymer binder and a light attenuating compound (as used herein, the term "light attenuating compound" is intended to include light absorbing compounds, chromophores, and any other compound which minimizes or prevents the transmittance of light) dissolved in a solvent system (either single or multiple solvents such as alcohols, ethers, glycol ethers, amides, esters, ketones, water, propylene glycol monomethyl ether, propylene glycol monomethyl ether acetate, ethyl lactate, and p-chlorobenzotrifluoride). Preferred polymer binders include each of the following in halogenated forms: polyesters, polyacrylates, polyheterocyclics, polyetherketones, polyhydroxystyrene, polycarbonates, polyepichlorohydrin, polyvinyl alcohol, oligomeric resins (such as crown ethers, cyclodextrins, epoxy resins), and mixtures of the foregoing, with acrylic polymers being particularly preferred.

The polymer binder should be present in the ARC at a level of from about 30–90% by weight, preferably from about 35–85% by weight, and more preferably from about 45–85% by weight, based upon the total weight of the ARC taken as 100% by weight. The weight average molecular weight of the polymer binder should be from about 1,000–1,000,000 Daltons, and preferably from about 3,000–200,000 Daltons. The ARC's preferably comprise from about 4–35% by weight, and preferably from about 8–32% by weight of a cross-linking agent, based upon the total weight of the ARC taken as 100% by weight. Preferred cross-linking agents include aminoplasts, epoxides, isocyanates, acrylics, and mixtures thereof. The inventive ARC's preferably also include from about 0.1–5.0% by weight, and more preferably from about 0.3–4.5% by weight of a catalyst such as 2,2'-azobisisobutyronitrile. Finally, the solvent system is preferably present in the ARC composition at a level of from about 60–99% by weight, preferably from about 65–99% by weight, and more preferably from about 70–98% by weight, based upon the total weight of the ARC taken as 100% by weight.

The polymer binder comprises halogen atoms bonded thereto, preferably in sufficient quantities so that the polymer binder comprises at least about 5% by weight halogen atoms, preferably from about 20–80% by weight halogen atoms, and more preferably from about 30–70% by weight halogen atoms, based upon the total weight of the polymer binder taken as 100% by weight. Preferred halogen atoms are those selected from the group consisting of fluorine, chlorine, and bromine atoms.

It is particularly preferred that the halogen atoms be bonded to a functional group on the polymer binder rather than directly to the polymer backbone (i.e., rather than to an atom which is along the direction of polymerization). Of the total halogen atoms present in the polymer binder, it is preferred that at least about 5%, preferably at least about 10%, and more preferably from about 20–80% by weight of the halogen atoms be bonded to a functional group on the polymer binder, with the percentages by weight being based upon the total weight of all halogen atoms present in the polymer binder taken as 100% by weight. Even more preferably, each functional group has two and preferably three halogen atoms bonded thereto, preferably to the same carbon atom.

In one embodiment, the polymer binder comprises recurring monomers having the formula

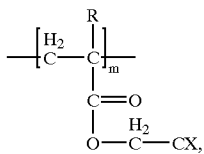

wherein: R in each monomer is individually selected from the group consisting of hydrogen and $C_1$–$C_8$ alkyls (preferably $C_1$–$C_4$ and more preferably $C_1$–$C_2$); X in each monomer is individually selected from the group consisting of the halogens and hydrogen halides, and preferably from the group consisting of —$H_2I$, —$HI_2$, —$I_3$, —$H_2F$, —$HF_2$, —$F_3$, —$H_2Cl$, —$HCl_2$, —$Cl_3$, —$H_2Br$, —$HBr_2$, and —$Br_3$; and m is from about 3–9,000, preferably from about 5–5,000, and more preferably from about 8–2,000.

Even more preferably, the polymer binder comprises recurring monomers having the formula

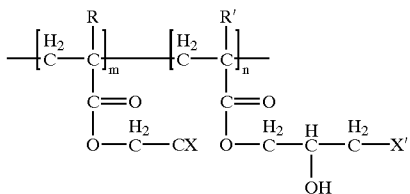

wherein: R and R' in each monomer are individually selected from the group consisting of hydrogen and $C_1$–$C_8$ alkyls (preferably $C_1$–$C_4$ and more preferably $C_1$–$C_2$); X in each monomer is individually selected from the group consisting of the halogens and hydrogen halides, and preferably from the group consisting of —$H_2I$, —$HI_2$, —$I_3$, —$H_2F$, —$HF_2$, —$F_3$, —$H_2Cl$, —$HCl_2$, —$Cl_3$, —$H_2Br$, —$HBr_2$, and —$Br_3$; X' is selected from the group consisting of hydrogen and light attenuating compounds; m is from about 1–8,000, preferably from about 1–5,000, and more preferably from about 1–1,600; and n is from about 1–3,000, preferably from about 1–1,500, and more preferably from about 1–600. In this embodiment, the molar ratio of m:n can be adjusted as necessary to modify the etch rate and absorbance desired for the particular application. Preferably, the molar ratio of m:n is from about 1:9 to about 9:1, and more preferably from about 2:8 to about 8:2.

Regardless of the embodiment, the light attenuating compound can be bonded to the polymer binder or simply mixed therewith. The light attenuating compound should be present in the polymer binder at a level of from about 4–50% by weight, preferably from about 10–45% by weight, and more preferably from about 10–30% by weight, based upon the total weight of the polymer binder taken as 100% by weight. Preferred light attenuating compounds for use in the inventive ARCs include naphthoic acid, anthracene, naphthalene, benzene, chalcone, phthalimides, pamoic acid, acridine, azo compounds, dibenzofuran, and derivatives thereof Those skilled in the art will appreciate that various other compounds may be added to the inventive ARC as desired. For example, a cross-linking agent and a catalyst for the cross-linking agent can be added to the ARC.

The inventive ARCs are formed with the above-described compounds utilizing known ARC preparation procedures. For example, all of the components of the ARC (i.e., the polymer binder, solvent system, cross-linking agent, catalyst, etc.) can be formed into a mixture and refluxed for about 24 hours under nitrogen. The polymer binders can also be prepared by known methods. For example, the desired monomers can be dissolved in a solvent and polymerized by a free radical polymerization reaction using a catalyst such as 2,2'-azobisisobutyronitrile. Those skilled in the art will appreciate that the reaction conditions, amount of catalyst, and other parameters can be adjusted to control the molecular weight of the final ARC composition.

The resulting ARC composition is subsequently applied to the surface of a substrate (e.g., silicon wafer) by conventional methods, such as by spin-coating, to form an antireflective coating layer on the substrate. The substrate and layer combination is baked at temperatures of at least about 160° C. The baked layer will generally have a thickness of anywhere from about 500 Å to about 2000 Å. Next, a photoresist can be applied to the ARC layer followed by exposing the photoresist to light at the desired wavelength, developing the exposed photoresist layer, and etching the developed photoresist layer all according to known procedures.

ARCs according to the invention have a dramatically improved etch rate, particularly those ARCs where halogen atoms are bonded to functional groups of the polymer binder. Thus, the ARCs have an etch selectivity to resist (i.e., the ARC etch rate divided by the photoresist etch rate) of at least about 1.2, preferably at least about 1.4, and more preferably at least about 1.5 when $CF_4$ is used as an etchant. Alternately, the etch rate of ARCs including a polymer binder halogenated on a functional group thereof is at least about 10%, preferably at least about 20%, and more preferably from about 30–100% greater than the etch rate of an ARC which includes the same polymer binder without halogenated functional groups. This faster etch rate is particularly important because prior art ARCs have etched substantially slower than the photoresist layer, thus resulting in overetching of the remaining photoresist layers. Use of faster etching ARCs prevents degradation of the photoresist during etching, which in turn protects the device layers.

Additionally, at 248 nm the inventive ARCs have a k value (i.e., the imaginary component of the complex index of refraction) of at least about 0.3, and preferably at least about 0.4, and have an n value (i.e., the ratio of the speed of light through a vacuum to the speed of light through the particular material) of at least about 1.35, and preferably at least about 1.45. Furthermore, when subjected to a stripping test as defined herein, the inventive ARCs will have a stripping amount of less than about 20 Å, and preferably less than about 10 Å. Finally, the ARCs give an interlayer formation result as defined herein of less than about 40 Å, and preferably less than about 30 Å.

DETAILED DESCRIPTION OF THE PREFERRED EMBODIMENTS

Examples

The following examples set forth preferred methods in accordance with the invention. It is to be understood, however, that these examples are provided by way of illustration and nothing therein should be taken as a limitation upon the overall scope of the invention.

Preparation of Materials

1. Monomers a. Trichloroethylacrylate (TCEA)

A first solution including trichloroethanol (30 g, 201 mmol) and triethylamine (22.36 g, 221 mmol) dissolved in 50 g of diethylether was prepared. A second solution comprising acryloyl chloride (20 g, 221 mmol) dissolved in 50 g of diethylether was added dropwise to the first solution followed by stirring for four hours at room temperature. The resulting solution was then added to water, and the organic phase was extracted. The organic phase was distilled to yield 32.28 g of TCEA (78.9% yield).

b. Trichloroethylmethacrylate (TCEMA)

A first solution including trichloroethanol (50 g, 335 mmol) and triethylamine (37.24 g, 368 mmol) dissolved in 50 g of diethylether was prepared. A second solution comprising methacryloyl chloride (38.47 g, 368 mmol) dissolved in 50 g of diethylether was added dropwise to the first solution followed by stirring for four hours at room temperature. The resulting solution was then added to water, and the organic phase was extracted. The organic phase was distilled to yield 39.33 g of TCEMA (54.0% yield).

c. Tribromoethylacrylate (TBEA)

A first solution including tribromoethanol (50 g, 177 mmol) and triethylamine (19.73 g, 195 mmol) dissolved in 50 g of diethylether was prepared. A second solution comprising acryloyl chloride (17.65 g, 195 mmol) dissolved in 50 g of diethylether was added dropwise to the first solution followed by stirring for four hours at room temperature. The resulting solution was then added to water, and the organic phase was extracted. The organic phase was distilled to yield 48.38 g of TBEA (72.5% yield).

d. Tribromoethylmethacrylate (TBEMA)

A first solution comprising tribromoethanol (50 g, 177 mmol) and triethylamine (19.73 g, 195 mmol) dissolved in 70 g of diethylether was prepared. A second solution comprising methacryloyl chloride (20.39 g, 195 mmol) dissolved in 70 g of diethylether was added dropwise to the first solution followed by stirring for four hours at room temperature. The resulting solution was then added to water, and the organic phase was extracted. The organic phase was distilled to yield 32.85 g of TBEMA (52.9% yield).

e. Chloroethylmethacrylate (CEMA)

A solution was prepared by dissolving 25 g of 2-chloroethanol (310 mmol) and 37.7 g of triethylamine (372.6 mmol) in 70 g of diethylether. Next, 33.72 g of chioroacrylate (272.6 mmol) dissolved in 70 g of diethylether was added drop wise to the solution at ambient temperatures with agitation being carried out for four hours. During the reaction, the reaction flask was cooled with water. The resulting solution was then washed with 300 g of water, 300 g of $KHCO_3$ (aq), and 300 g of NaCl (aq). The organic phase was dried with $Na_2SO_4$, and the diethylether was removed by distillation. The yield of the chloroethylacrylate was 91%.

2. Polymers a. Polytrifluoroethylacrylate (P-TFEA)

A solution was prepared by dissolving 30 g of trifluoroethylacrylate (195 mmol) in 111.2 g of propylene glycol monomethyl ether, with the solution being maintained at 70° C. Next, 0.3 g of 2,2'-azobisisobutyronitrile dissolved in 10 g of propylene glycol monomethyl ether was added to this solution followed by stirring under nitrogen for 24 hours at 70° C.

b. Polytrifluoroethylmethacrylate (P-TFEMA)

A solution was prepared by dissolving 30 g of trifluoroethylmethacrylate (178 mmol) in 111.2 g of propylene glycol monomethyl ether, with the solution being maintained at 70° C. Next, 0.3 g of 2,2'-azobisisobutyronitrile dissolved in 10 g of propylene glycol monomethyl ether was added to this solution followed by stirring under nitrogen for 24 hours at 70° C.

c. Polytrichloroethylacrylate (P-TCEA)

A solution was prepared by dissolving 30 g of trichloroethylacrylate (147 mmol) in 111.2 g of propylene glycol monomethyl ether, with the solution being maintained at 70° C. Next, 0.3 g of 2,2'-azobisisobutyronitrile dissolved in 10 g of propylene glycol monomethyl ether was added to this solution followed by stirring under nitrogen for 24 hours at 70° C.

d. Polytrichloroethylmethacrylate (P-TCEMA)

A solution was prepared by dissolving 30 g of trichloroethylmethacrylate (138 mmol) in 111.2 g of propylene glycol monomethyl ether, with the solution being maintained at 70° C. Next, 0.3 g of 2,2'-azobisisobutyronitrile dissolved in 10 g of propylene glycol monomethyl ether was added to this solution followed by stirring under nitrogen for 24 hours at 70° C.

e. Polytrichloroethylmethacrylate (P-TCEMA)

A solution was prepared by dissolving 30 g of trichloroethylmethacrylate (138 mmol) in 111.2 g of propylene glycol monomethyl ether, with the solution being maintained at 50° C. Next, 0.3 g of 2,2'-azobis-(2,4-dimethyl valeronitrile) dissolved in 10 g of propylene glycol monomethyl ether was added to this solution followed by stirring under nitrogen for 24 hours at 50° C.

f. Polytribromoethylacrylate (P-TBEA)

A solution was prepared by dissolving 30 g of tribromoethylacrylate (89 mmol) in 111.2 g of propylene glycol monomethyl ether, with the solution being maintained at 70° C. Next, 0.3 g of 2,2'-azobisisobutyronitrile dissolved in 10 g of propylene glycol monomethyl ether was added to this solution followed by stirring under nitrogen for 24 hours at 70° C.

g. Polychloroethylacrylate (P-CEA)

A solution was prepared by dissolving 20 g of chloroethylacrylate (148.6 mmol) in 61.81 g of propylene glycol monomethyl ether (PGME), with the solution being maintained at 70° C. Next, 0.01 g of 2,2'-azobisisobutyronitrile dissolved in 6.7 g of PGME was added to the solution. The resulting solution was stirred under nitrogen for 24 hours at 70° C.

h. Polybromoacrylate (P-BA)

A solution of 20 g of methacrylate (249.8 mmol) dissolved in 80 g of diethylether was prepared. A second solution containing 40.83 g of bromine (255 mmol) dissolved in 200 g of diethylether was added drop wise to the first solution under ambient temperatures with agitation of the resulting solution being carried out for one hour. During the reaction, the reaction flask was cooled with water. The resulting solution was washed with water, $KHCO_3$ (aq), and water again, in order. The organic phase was dried with $Na_2SO_4$, and the diethylether was removed by distillation. Thirty grams of the resulting compound was mixed with 40.5 g of 3N NaOH (aq) under agitation. The reaction flask was cooled with ice water throughout the eight-hour reaction. The polymer precipitated in the reaction solution, and was then dissolved in dimethyl formamide (DMF) and reprecipitated in 700 ml of methanol. The yield of the polymer was 20.5%.

3. Copolymers a. Copolytrifluoroethylmethacrylate/glycidylmethacrylate (65/35 mol/mol) (P-TFEMA/GMA (65/35))

A solution was prepared by dissolving 26.01 g of trifluoroethylmethacrylate (155 mmol) and 11.83 g of glycidylmethacrylate (83 mmol) in 142.88 g of propylene glycol monomethyl ether, with the solution being maintained at 70° C. Next, 0.38 g of 2,2'-azobisisobutyronitrile dissolved in 10 g of propylene glycol monomethyl ether was added to this solution followed by stirring under nitrogen for 24 hours at 70° C.

b. Copolytrichloroethylmethacrylate/glycidylmethacrylate (65/35 mol/mol) (P-TCEMA/GMA (65/35))

A solution was prepared by dissolving 20 g of trichloroethylmethacrylate (92 mmol) and 7.04 g of glycidylmethacrylate (50 mmol) in 99.24 g of propylene glycol monomethyl ether, with the solution being maintained at 70° C. Next, 0.27 g of 2,2'-azobisisobutyronitrile dissolved in 10 g of propylene glycol monomethyl ether was added to this solution followed by stirring under nitrogen for 24 hours at 70° C.

c. Copolytrichloroethylmethacrylate/glycidylmethacrylate (65/35 mol/mol) (P-TCEMAi/GMA (65/35))

A solution was prepared by dissolving 20 g of trichloroethylmethacrylate (92 mmol) and 7.04 g of glycidylmethacrylate (50 mmol) in 99.24 g of propylene glycol monomethyl ether, with the solution being maintained at 50° C. Next, 0.27 g of 2,2'-azobis-(2,4-dimethyl valeronitrile) dissolved in 10 g of propylene glycol monomethyl ether was added to this solution followed by stirring under nitrogen for 24 hours at 50° C.

d. Copolytrichloroethylacrylate/glycidylmethacrylate (65/35 mol/mol) (P-TCEA/GMA (65/35))

A solution was prepared by dissolving 10 g of trichloroethylacrylate (49 mmol) and 3.76 g of glycidylmethacrylate (27 mmol) in 45.6 g of propylene glycol monomethyl ether, with the solution being maintained at 70° C. Next, 0.14 g of 2,2'-azobisisobutyronitrile dissolved in 10 g of propylene glycol monomethyl ether was added to this solution followed by stirring under nitrogen for 24 hours at 70° C.

e. Copolytribromoethylacrylate/glycidylmethacrylate (65/35 mol/mol) (P-TBEMA/GMA (65/35))

A solution was prepared by dissolving 20 g of tribromoethylacrylate (59 mmol) and 4.55 g of glycidylmethacrylate (32 mmol) in 89.2 g of propylene glycol monomethyl ether, with the solution being maintained at 70° C. Next, 0.25 g of 2,2'-azobisisobutyronitrile dissolved in 10 g of propylene glycol monomethyl ether was added to this solution followed by stirring under nitrogen for 24 hours at 70° C.

f. Copolytrichloroethylmethacrylate/glycidylmethacrylate (70/30 mol/mol) (P-TCEMA/GMA (70/30))

A solution was prepared by dissolving 10.82 g of trichloroethylmethacrylate (50 mmol) and 3.03 g of glycidylmethacrylate (21 mmol) in 45.95 g of propylene glycol monomethyl ether, with the solution being maintained at 50° C. Next, 0.14 g of 2,2'-azobis-(2,4-dimethyl valeronitrile) dissolved in 10 g of propylene glycol monomethyl ether was added to this solution followed by stirring under nitrogen for 24 hours at 50° C.

g. Copo/ytrichloroethylmethacrylate/glycidylmethacrylate (75/25 mol/mol) (P-TCEMA/GMA (75/25))

A solution was prepared by dissolving 13.39 g of trichloroethylmethacrylate (62 mmol) and 2.91 g of glycidylmethacrylate (21 mmol) in 55.85 g of propylene glycol monomethyl ether, with the solution being maintained at 50° C. Next, 0.16 g of 2,2'-azobis-(2,4-dimethyl valeronitrile) dissolved in 10 g of propylene glycol monomethyl ether was added to this solution followed by stirring under nitrogen for 24 hours at 50° C.

h. Copoly-VC/GMA

In this preparation, 8.03 g of vinylidenedichloride (83 mmol), 11.77 g of glycidylmethacrylate (83 mmol), 0.20 g of 2,2'-azobisisobutyronitrile (1.21 mmol), and 80 g of dioxane were charged into a 200 ml autoclave followed by stirring for 24 hours at 70° C. and under nitrogen.

i. Copoly-VC/MAL

In this preparation, 9.85 g of vinylidenedichloride (102 mmol), 9.95 g of maleic anhydride (102 mmol), 0.20 g of 2,2'-azobisisobutyronitrile (1.21 mmol), and 80 g of dioxane were charged into a 200 ml autoclave followed by stirring for 24 hours at 70° C. and under nitrogen.

4. Anti-reflective Coatings (ARCs)

a. ARC containing copolytrifluoroethylmethacrylate/glycidylmethacrylate —ARC [P-TFEMA/GMA (65/35)]

A mixture of 20 g P-TFEMA/GMA (65/35) in 80 g of propylene glycol monomethyl ether (epoxy value=0.4403), 9 g of 9-anthracenecarboxylic acid (41 mmol), 0.24 g benzyltriethylammoniumchloride (1.1 mmol), and 36.96 g of propylene glycol monomethyl ether was refluxed for 24 hours under nitrogen.

b. ARC containing copolytrichloroethylmethacrylate/glycidylmethacrylate —ARC [P-TCEMA/GMA (65/35)]

A mixture of 4 g P-TCEMA/GMA (65/35) in 16 g of propylene glycol monomethyl ether (epoxy value=0.3663), 1.5 g of 9-anthracenecarboxylic acid (6.7 mmol), 0.04 g benzyltriethylammoniumchloride (0.18 mmol), and 6.16 g of propylene glycol monomethyl ether was refluxed for 24 hours under nitrogen.

c. ARC containing copolytrichloroethylacrylate/glycidylmethacrylate—ARC [P-TCEA/GMA (65/35)]

A mixture 4 g of P-TCEA/GMA (65/35) in 16 g of propylene glycol monomethyl ether (epoxy value=0.3845), 1.6 g of 9-anthracenecarboxylic acid (7.1 mmol), 0.04 g benzyltriethylammoniumchloride (0.18 mmol), and 6.56 g of propylene glycol monomethyl ether was refluxed for 24 hours under nitrogen.

d. ARC containing copolytrichloroethylmethacrylate/glycidylmethacrylate—ARC [P-TCEMA/GMA (70/30)]

A mixture of 4 g of P-TCEMA/GMA (70/30) in 16 g of propylene glycol monomethyl ether (epoxy value=0.3079), 1.26 g of 9-anthracenecarboxylic acid (5.7 mmol), 0.03 g benzyltriethylammoniumchloride (0.15 mmol), and 5.16 g of propylene glycol monomethyl ether was refluxed for 24 hours under nitrogen.

e. ARC containing copolytrichloroethylmethacrylate/glycidylmethacrylate—ARC [P-TCEMA/GMA (75/25)]

A mixture of 4 g of P-TCEMA/GMA (75/25) in 16 g of propylene glycol monomethyl ether (epoxy value=0.2517), 1.03 g of 9-anthracenecarboxylic acid (4.6 mmol), 0.03 g benzyltriethylammoniumchloride (0.12 mmol), and 4.24 g of propylene glycol monomethyl ether was refluxed for 24 hours under nitrogen.

Testing Procedures

1. Stripping Test Procedure

In some of the following examples, a stripping test was performed to determine the resistance of the experimental anti-reflective coating (ARC) to photoresist solvents. In this procedure, the ARC formulation was spin-coated onto a silicon wafer at a spin speed of 2,500 rpm for 60 seconds and at an acceleration of 20,000 rpm/second. The film was baked on a hotplate at 205° C. for 60 seconds. The ARC film thickness was then measured at multiple points on the wafer using ellipsometry.

Ethyl lactate was puddled onto the silicon wafer for 10 seconds, followed by spin drying at 3,500 rpm for 30 seconds to remove the solvent. The film was then baked on a hotplate at 100° C. for 30 seconds. The ARC film thickness was again measured at multiple points on the wafer using ellipsometry. The amount of stripping was determined to be the difference between the initial and final average film thicknesses. A stripping test result of less than 20 Å was considered acceptable.

2. Interlayer Formation Procedure

In some of the following examples, the degree of intermixing between the sample ARC and the photoresist was determined. In this procedure, the ARC formulation was spin-coated onto a silicon wafer at a spin speed of 2,500 rpm for 60 seconds and at an acceleration of 20,000 rpm/second. The film was baked on a hotplate at 205° C. for 60 seconds. The ARC film thickness was then measured at multiple points on the wafer using ellipsometry.

A photoresist (UV6, available from Shipley) was spin-coated on top of the ARC film at a spin speed of 3250 rpm for 30 seconds and at an acceleration of 20,000 rpm/second under ambient conditions. The wafer was then baked on a hotplate for 130° C. for 60 seconds and exposed to 20 mJ of exposure energy, after which a post-exposure bake was performed on the wafer at 130° C. for 90 seconds.

The photoresist was developed with Shipley LDD26W developer for 40 seconds. The sample was then rinsed with distilled water and spun dry at 2,000 rpm for 20 seconds followed by baking on a hotplate for 100° C. for 30 seconds. The film thickness was again measured at multiple points on the wafer using ellipsometry. The difference in the two film thickness averages (Å) was recorded as the interlayer formation result.

3. Etching Conditions

In each of the following examples the etch rate and etch selectivity was determined by etching the particular layer with an RIE System ES401 (Nippon Scientific Company, Ltd.) using the particular etchant indicated in the tables. This was accomplished by spin-coating the sample onto a silicon wafer and measuring the thickness of the layer on the wafer (this value was designated as "A"). The layer was then etched, and the thickness was measured after etching (this value was designated as "B"). The etch rate was calculated as follows: (A−B)/etching time (min). The etch selectivity was then calculated as follows: (etch rate of the sample)/(etch rate of a control).

Example 1

In this example, homopolymers were halogenated on a functional group of the homopolymer (i.e., the halogens were not attached directly to the polymer backbone), and the etch selectivity of the halogenated homopolymer was determined. The tested homopolymers are represented by Formula I. The etch selectivity results are set forth in Table 1. These results indicate that the etch rate dramatically increased as the number of halogens bonded to a particular homopolymer functional group increased. Additionally, the etch rate increased as the molecular weight of the substituted halogens increased.

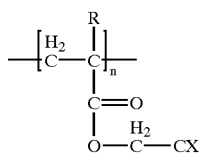

Formula I

Where R is —H or —CH$_3$ and X is —F$_3$, —Cl$_3$, —H$_2$Cl, or —Br$_3$, as indicated in Table 1.

TABLE 1

The Etch Selectivity of Halogenated Acrylic Homopolymers.

| | | R = —CH$_3$ | R = —H |
|---|---|---|---|
| X = —F$_3$ | homopolymer name | P-TFEMA | P-TFEA |
| | MW/MN[a] | 31,000/15,000 (2.07)[b] | 18,000/8,500 (2.12) |
| | n value (at 248 nm) | 1.47 | 1.48 |
| | etch selectivity (CF$_4$)[c] | | |
| | with CD11[d] | 2.30 | 2.68 |
| | with P-HPMA | 1.29 | 1.51 |
| | etch selectivity (CF$_4$/O$_2$ = 9/1)[e] | | |
| | with CD11 | 2.29 | 2.35 |
| | with P-HPMA | 1.15 | 1.18 |
| X = —Cl$_3$ | homopolymer name | P-TCEMA | P-TCEA |
| | MW/MN | 47,000/18,000 (2.70) | 9,800/3,700 (2.65) |
| | n value (at 248 nm) | 1.60 | 1.62 |
| | etch selectivity (CF$_4$) | | |
| | with CD11 | 3.09 | 3.35 |
| | with P-HPMA | 1.74 | 1.88 |
| | etch selectivity (CF$_4$/O$_2$ = 9/1) | | |
| | with CD11 | 2.54 | 2.33 |
| | with P-HPMA | 1.28 | 1.17 |
| X = —H$_2$Cl | homopolymer name | P-CEMA | P-CEA |
| | MW/MN | — | 50,000/9,800 (5.10) |
| | n value (at 248 nm) | — | 1.59 |
| | etch selectivity (CF$_4$) | | |
| | with CD11 | — | 2.11 |
| | with P-HPMA | — | 1.19 |
| | etch selectivity (CF$_4$/O$_2$ = 9/1) | | |
| | with CD11 | — | 2.03 |
| | with P-HPMA | — | 1.02 |
| X = —Br$_3$ | homopolymer name | P-TBEMA | P-TBEA |
| | MW/MN | — | 31,000/6,300 (4.92) |
| | n value (at 248 nm) | — | 1.75 |

TABLE 1-continued

The Etch Selectivity of Halogenated Acrylic Homopolymers.

| | R = —CH$_3$ | R = —H |
|---|---|---|
| etch selectivity (CF$_4$) | | |
| with CD11 | — | 3.38 |
| with P-HPMA | — | 1.90 |
| etch selectivity (CF$_4$/O$_2$ = 9/1) | | |
| with CD11 | — | 2.67 |
| with P-HPMA | — | 1.34 |
| reference[f] homopolymer name | P-HPMA | |
| MW/MN | 39,000/17,000 (2.29) | |
| n value (at 248 nm) | 1.58 | |
| etch selectivity (CF$_4$) | | |
| with CD11 | 1.78 | |
| with P-HPMA | 1.00 | |
| etch selectivity (CF$_4$/O$_2$ = 9/1) | | |
| with CD11 | 1.99 | |
| with P-HPMA | 1.00 | |

[a] Molecular weight average/number average.
[b] The number in parenthesis corresponds to MW ÷ MN.
[c] Indicates the etchant used in this test.
[d] An anti-reflective coating useful for absorbing light at 248 nm and available from Brewer Science, Inc.
[e] Indicates weight ratio of components of etchant in this test.
[f] The reference was P-HPMA which comprises monomers of the formula

Example 2

In this example, copolymers were halogenated on the backbone of the copolymer, and the etch selectivity of the halogenated copolymer was determined as compared to a reference (P-HPMA). The tested copolymers are represented by Formulas II–IV. The etch selectivity results are set forth in Table 2. The etch rate was not improved or only mildly improved when halogens were added directly to the polymer backbone.

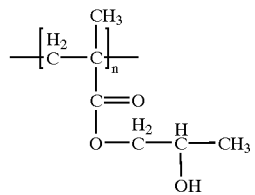

Poly-hydroxypropylmethacrylate (P-HPMA)

Formula II

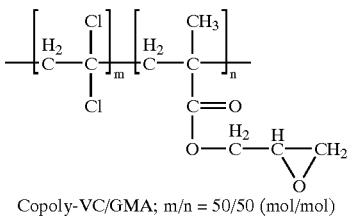

Copoly-VC/GMA; m/n = 50/50 (mol/mol)

Formula III

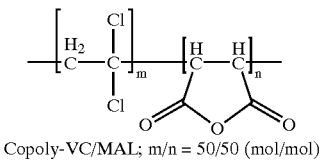

Copoly-VC/MAL; m/n = 50/50 (mol/mol)

Formula IV

TABLE 2

The Etch Selectivity of Halogenated Acrylic Homopolymers.

| copolymer name | Poly-BA | Copoly-VC/GMA | Copoly-VC/MAL |
|---|---|---|---|
| MW/MN[a] | 30,000/12,000 (2.46)[b] | 17,000/5,800 (2.97) | 43,000/2,300 (1.85) |
| n value (at 248 nm) | 1.65 | 1.63 | 1.71 |
| etch selectivity (CF$_4$)[c] | | | |
| with CD11 | 2.01 | 1.77 | 2.20 |
| with P-HPMA | 1.13 | 1.00 | 1.24 |
| etch selectivity | | | |

TABLE 2-continued

The Etch Selectivity of Halogenated Acrylic Homopolymers.

| copolymer name | Poly-BA | Copoly-VC/GMA | Copoly-VC/MAL |
|---|---|---|---|
| $(CF_4/O_2 = 9/1)^d$ | | | |
| with CD11 | — | 1.70 | — |
| with P-HPMA | — | 0.85 | — |

[a]Molecular weight average/number average.
[b]The number in parenthesis corresponds to MW ÷ MN.
[c]Indicates the etchant used in this test.
[d]Indicates weight ratio of components of etchant in this test.

Example 3

In this example, copolymers were halogenated on functional groups of the copolymer (i.e., the halogens were not attached directly to the polymer backbone) which was grafted with a chromophore. The respective etch selectivities of the resulting ARCs were determined as compared to a reference (DUV42, see Formula V). The tested copolymers are represented by Formula VI. The etch selectivity results are set forth in Table 3.

Formula V

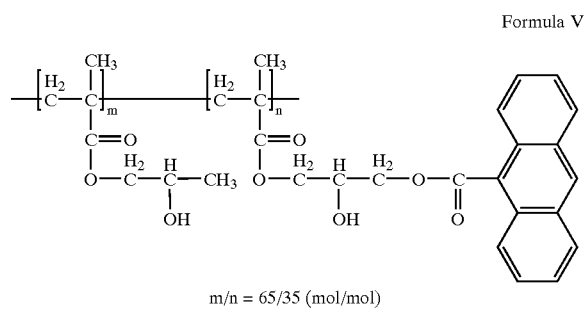

m/n = 65/35 (mol/mol)

Formula VI

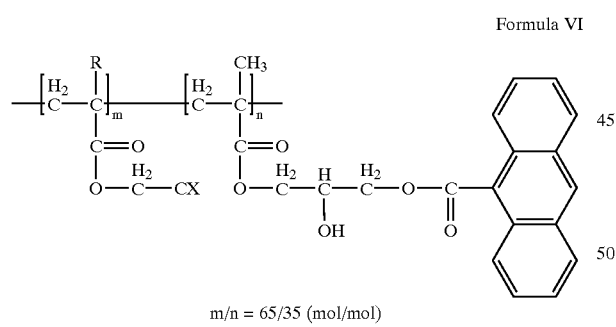

m/n = 65/35 (mol/mol)

Where "R" is —H or —$CH_3$, and "X" is —$F_3$ or —$Cl_3$, as indicated in Table 3.

TABLE 3

The Etch Selectivity, n value, and k value of Halogenated ARCs

| Base Polymer | Copoly-TFEMA/GMA[a] | Copoly-TCEMA/GMA[b] | Copoly-TCEA/GMA[c] | DUV42 (reference) |
|---|---|---|---|---|
| n value (at 248 nm) | 1.47 | 1.49 | 1.47 | 1.48 |
| k value (at 248 nm) etch selectivity $(CF_4)^d$ | 0.475 | 0.444 | 0.467 | 0.495 |
| with CD11 | 1.44 | 1.59 | 1.57 | 1.29 |
| with DUV42 | 1.12 | 1.22 | 1.21 | 1.00 |
| with APEX-E[e] etch selectivity $(CF_4/O_2 = 9/1)^f$ | 1.53 | 1.69 | 1.67 | 1.37 |
| with CD11 | 1.48 | 1.51 | 1.51 | 1.38 |
| with DUV42 | 1.07 | 1.09 | 1.09 | 1.00 |
| with APEX-E | 1.59 | 1.62 | 1.62 | 1.48 |

[a]Formula VI, where "R" is —$CH_3$ and "X" is —$F_3$.
[b]Formula VI, where "R" is —$CH_3$ and "X" is —$Cl_3$.
[c]Formula VI, where "R" is —H and "X" is —$Cl_3$.
[d]Indicates the etchant used in this test.
[e]A photoresist available from Shipley.
[f]Indicates weight ratio of components of etchant in this test.

Example 4

In this example, copolymers were halogenated on a functional group of the copolymer (i. e., the halogens were not attached directly to the polymer backbone) which was grafted with a chromophore similar to Example 3. The etch selectivity of the ARC was then determined. The copolymers of the polymer binder in the tested ARC are represented by Formula VII, with varying molar ratios of "m" and "n" being tested. The etch selectivity results are set forth in Table 4. These results indicate that ARCs formed with polymers having halogentated functional groups can have the molar ratio of the copolymer members varied to adjust the properties of the ARC.

Formula VII

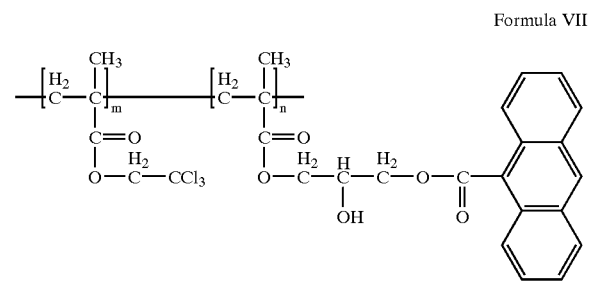

TABLE 4

The Etch Selectivity, n value, and k value of Halogenated ARCs

| Polymer solid/ PWL[a] = 4.13/0.2 (wt/wt) PWL/pTSA[b] = 10/1 (wt/wt) | m/n (mol/mol) | 65/35 | 70/30 | 75/25 |
|---|---|---|---|---|
| | n value (at 248 nm) | 1.48 | 1.50 | 1.52 |
| | k value (at 248 nm) | 0.491 | 0.431 | 0.365 |
| | stripping test | Okay[c] | Okay | Okay |
| | interlayer test (Å) | 29 | 30 | 51 |
| | etch selectivity $(CF_4)^d$ | | | |
| | with CD11 | 1.57 | 1.66 | 1.76 |
| | with DUV42 | 1.21 | 1.28 | 1.35 |
| | with APEX-E | 1.67 | 1.77 | 1.87 |
| | etch selectivity $(CF_4/$ | | | |

TABLE 4-continued

The Etch Selectivity, n value, and k value of Halogenated ARCs

| | | $O_2 = 9/1)^e$ | | |
|---|---|---|---|---|
| | with CD11 | 1.52 | 1.60 | 1.69 |
| | with DUV42 | 1.10 | 1.16 | 1.22 |
| | with APEX-E | 1.63 | 1.72 | 1.82 |
| Polymer solid/ | m/n (mol/mol) | 65/35 | 70/30 | 75/25 |
| PWL = 4.13/0.5 | n value (at 248 nm) | 1.48 | 1.48 | 1.50 |
| (wt/wt) | k value (at 248 nm) | 0.485 | 0.441 | 0.354 |
| PWL/pTSA = | stripping test | Okay | Okay | Okay |
| 10/1 (wt/wt) | interlayer test (Å) | 13 | 18 | 22 |
| | etch selectivity ($CF_4$/ $O_2 = 9/1$) | | | |
| | with CD11 | 1.58 | 1.65 | 1.75 |
| | with DUV42 | 1.22 | 1.27 | 1.35 |
| | with APEX-E | 1.68 | 1.76 | 1.86 |
| | with CD11 | 1.51 | 1.58 | 1.63 |
| | with DUV42 | 1.09 | 1.14 | 1.18 |
| | with APEX-E | 1.62 | 1.70 | 1.75 |
| Polymer solid/ | m/n (mol/mol) | 65/35 | 70/30 | 75/25 |
| PWL = 4.13/1 | n value (at 248 nm) | 1.48 | 1.49 | 1.50 |
| (wt/wt) | k value (at 248 nm) | 0.444 | 0.392 | 0.332 |
| PWL/pTSA = | stripping test | Okay | Okay | Okay |
| 10/1 (wt/wt) | interlayer test (Å) | 13 | 14 | 21 |
| | etch selectivity ($CF_4$) | | | |
| | with CD11 | 1.59 | 1.68 | 1.81 |
| | with DUV42 | 1.22 | 1.29 | 1.39 |
| | with APEX-E | 1.69 | 1.79 | 1.93 |
| | etch selectivity ($CF_4$/ $O_2 = 9/1$) | | | |
| | with CD11 | 1.51 | 1.59 | 1.68 |
| | with DUV42 | 1.09 | 1.15 | 1.22 |
| | with APEX-E | 1.62 | 1.71 | 1.81 |
| Polymer solid/ | m/n (mol/mol) | 65/35 | 70/30 | 75/25 |
| PWL = 4.13/2 | n value (at 248 nm) | 1.51 | 1.52 | 1.52 |
| (wt/wt) | k value (at 248 nm) | 0.402 | 0.358 | 0.297 |
| PWL/pTSA = | stripping test | Okay | Okay | Okay |
| 10/1 (wt/wt) | interlayer test (Å) | 13 | 17 | 20 |
| | etch selectivity ($CF_4$) | | | |
| | with CD11 | 1.66 | 1.73 | 1.86 |
| | with DUV42 | 1.28 | 1.33 | 1.43 |
| | with APEX-E | 1.77 | 1.84 | 1.98 |
| | etch selectivity ($CF_4$/ $O_2 = 9/1$) | | | |
| | with CD11 | 1.57 | 1.70 | 1.74 |
| | with DUV42 | 1.14 | 1.23 | 1.26 |
| | with APEX-E | 1.69 | 1.83 | 1.87 |
| Polymer solid/ | m/n (mol/mol) | 65/35 | 70/30 | 75/25 |
| $CYM^f$ = 7.6/1 | n value (at 248 nm) | 1.51 | — | — |
| (wt/wt) | k value (at 248 nm) | 0.460 | — | — |
| CYM/pTSA = 25/ | stripping test | Okay | — | — |
| 1 (wt/wt) | interlayer test (Å) | 20 | — | — |
| | etch selectivity ($CF_4$) | | | |
| | with CD11 | 1.67 | — | — |
| | with DUV42 | 1.28 | — | — |
| | with APEX-E | 1.78 | — | — |
| | etch selectivity ($CF_4$/ $O_2 = 9/1$) | | | |
| | with CD11 | 1.50 | — | — |
| | with DUV42 | 1.09 | — | — |
| | with APEX-E | 1.61 | — | — |

[a]PWL is a cross-linker available from CYTEC Industries.
[b]p-toluenesulfonic acid.
[c]Indicates a stripping test result of less than 10 Å.
[d]Indicates etchant utilized.
[e]Indicates weight ratio of components of etchant in this test.
[f]CYM is a cross-linker available from CYTEC Industries.

We claim:

1. In a curable, anti-reflective composition for use during microlithographic processes, said composition comprising a polymer binder and a light attenuating compound dispersed in a solvent system, the improvement which comprises said polymer binder comprising recurring monomers according to the formula:

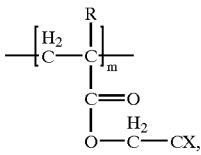

wherein R in each monomer of the polymer binder is individually selected from the group consisting of hydrogen and $C_1$–$C_8$ alkyls, and X in each monomer of the polymer binder is individually selected from the group consisting of —$HI_2$, —$I_3$, —$HF_2$, —$F_3$, —$HCl_2$, —$Cl_3$, —$HBr_2$, and —$Br_3$.

2. The composition of claim 1, wherein said light attenuating compound is bonded to the polymer binder.

3. The composition of claim 1, wherein said composition further comprises a cross-linking agent and a catalyst for said cross-linking agent.

4. The composition of claim 1, wherein said composition has an etch selectivity to resist of at least about 1.2 when $CF_4$ is used as an etchant.

5. The composition of claim 1, wherein the weight average molecular weight of said polymer binder is from about 1,000–1,000,000 Daltons.

6. The composition of claim 1, wherein said composition has a k value of at least about 0.3 at about 248 nm.

7. The composition of claim 1, wherein said composition has an n value of at least about 1.35 at about 248 nm.

8. In a curable, anti-reflective composition for use during microlithographic processes, said composition comprising a polymer binder and a light attenuating compound dispersed in a solvent system, the improvement which comprises said polymer binder comprising recurring monomers according to the formula:

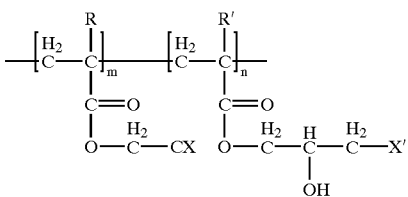

wherein R and R' in each monomer of the polymer binder are individually selected from the group consisting of hydrogen and $C_1$–$C_8$ alkyls, X in each monomer of the polymer binder is individually selected from the group consisting of —$H_2$, —$I_3$, —$HF_2$, —$F_3$, —$HCl_2$, —$Cl_3$, —$HBr_2$, and —$Br_3$, and X' in each monomer of the polymer binder is individually selected from the group consisting of hydrogen and light attenuating compounds.

9. The composition of claim 8, wherein X' is a light attenuating compound selected from the group consisting of naphthoic acid, anthracene, naphthalene, benzene, chalcone, phthalimides, pamoic acid, acridine, azo compounds, dibenzofuran, and derivatives thereof.

10. The composition of claim 8, wherein the molar ratio of m:n is from about 1:9 to about 9:1.

11. The composition of claim 8, wherein X' is a light attenuating compound present in said polymer binder at a level of from about 4–50% by weight, based upon the total weight of the polymer binder taken as 100% by weight.

12. The composition of claim 8, wherein the weight average molecular weight of said polymer binder is from about 1,000–1,000,000 Daltons.

13. The composition of claim 8, wherein said composition has a k value of at least about 0.3 at about 248 nm.

14. The composition of claim 8, wherein said composition has an n value of at least about 1.35 at about 248 nm.

15. A method of forming a precursor structure for use in manufacturing integrated circuits, said method comprising the step of applying a quantity of an anti-reflective composition according to claim 1 to the surface of a substrate to form an anti-reflective layer on said substrate surface.

16. The method of claim 15, wherein said anti-reflective layer has a k value of at least about 0.3 at about 248 nm.

17. The method of claim 15, wherein said composition has an n value of at least about 1.35 at about 248 nm.

18. The method of claim 15, wherein said applying step comprises spin-coating said composition on said substrate surface.

19. The method of claim 15, further including the step of baking said anti-reflective layer after said applying step at a temperature of at least about 1600° C.

20. The method of claim 15, further including the step of applying a photoresist to said anti-reflective layer.

21. The method of claim 15, furthering including the steps of:

exposing at least a portion of said photoresist layer to activating radiation;

developing said exposed photoresist layer; and etching said developed photoresist layer.

22. The method of claim 15, wherein said anti-reflective layer has an etch selectivity to resist of at least about 1.2 when $CF_4$ is used as an etchant.

23. A method of forming a precursor structure for use in manufacturing integrated circuits, said method comprising the step of applying a quantity of an anti-reflective composition according to claim 8 to the surface of a substrate to form an anti-reflective layer on said substrate surface.

24. The method of claim 23, wherein X' is a light attenuating compound selected from the group consisting of naphthoic acid, anthracene, naphthalene, benzene, chalcone, phthalimides, pamoic acid, acridine, azo compounds, dibenzofuran, and derivatives thereof.

25. The method of claim 23, wherein the molar ratio of m:n is from about 1:9 to about 9:1.

26. The method of claim 23, wherein X' is a light attenuating compound present in said polymer binder at a level of from about 4–50% by weight, based upon the total weight of the polymer binder taken as 100% by weight.

27. The combination of a substrate having a surface and an anti-reflective layer on said substrate surface, said anti-reflective layer including therein a polymer binder comprising recurring monomers according to the formula:

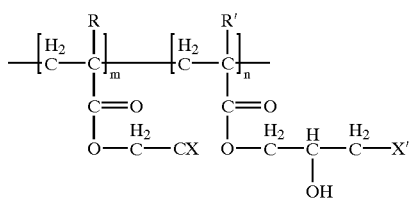

wherein R and R' in each monomer of the polymer binder are individually selected from the group consisting of hydrogen and $C_1$–$C_8$ alkyls, X in each monomer of the polymer binder is individually selected from the group consisting of —$HI_2$, —$I_3$, —$HF_2$, —$F_3$, —$HCl_2$, —$Cl_3$, —$HBr_2$, and —$Br_3$, and X' in each monomer of the polymer binder is individually selected from the group consisting of the hydrogen and light attenuating compounds.

28. The combination of claim 27, wherein X' is a light attenuating compound selected from the group consisting of naphthoic acid, anthracene, naphthalene, benzene, chalcone, phthalimides, pamoic acid, acridine, azo compounds, dibenzofuran, and derivatives thereof.

29. The combination of claim 27, wherein the molar ratio of m:n is from about 1:9 to about 9:1.

30. The combination of claim 27, wherein X' is a light attenuating compound present in said polymer binder at a level of from about 4–50% by weight, based upon the total weight of the polymer binder taken as 100% by weight.

31. In a curable, anti-reflective composition for use during microlithographic processes, said composition comprising a polymer binder and a light attenuating compound dispersed in a solvent system, the improvement which comprises said polymer binder comprising recurring monomers according to the formula:

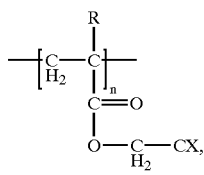

wherein R in each monomer of the polymer binder is individually selected from the group consisting of hydrogen and $C_1$–$C_8$ alkyls, and X in each monomer of the polymer binder is individually selected from the group consisting of the halogens and hydrogen halides, said polymer binder comprising from about 20–80% by weight halogen atoms, based upon the total weight of the polymer binder taken as 100% by weight.

32. The composition of claim 31, wherein said composition further comprises a cross-linking agent and a catalyst for said cross-linking agent.

33. In a curable, anti-reflective composition for use during microlithographic processes, said composition comprising a polymer binder and a light attenuating compound dispersed in a solvent system, the improvement which comprises said polymer binder comprising recurring monomers according to the formula:

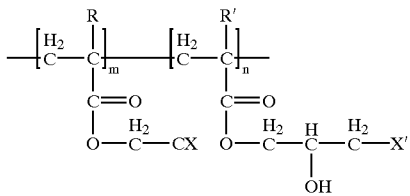

wherein R and R' in each monomer of the polymer binder are individually selected from the group consisting of hydrogen and $C_1$–$C_8$ alkyls, X in each monomer of the polymer binder is individually selected from the group consisting of the halogens and hydrogen halides, and X' in each monomer of the polymer binder is individually selected from the group consisting of hydrogen and light attenuating compounds, said polymer binder comprising from about 20–80% by weight halogen atoms, based upon the total weight of the polymer binder taken as 100% by weight.

34. The composition of claim 33, wherein the molar ratio of m:n is from about 1:9 to about 9:1.

35. The composition of claim 33, wherein X' is a light attenuating compound present in said polymer binder at a level of from about 4–50% by weight, based upon the total weight of the polymer binder taken as 100% by weight.

36. A method of forming a precursor structure for use in manufacturing integrated circuits, said method comprising the step of applying a quantity of an anti-reflective composition according to claim 31 to the surface of a substrate to form an anti-reflective layer on said substrate surface.

37. The method of claim 36, further including the step of applying a photoresist to said anti-reflective layer.

38. The method of claim 37, furthering including the steps of:
   exposing at least a portion of said photoresist layer to activating radiation;
   developing said exposed photoresist layer; and
   etching said developed photoresist layer.

39. A method of forming a precursor structure for use in manufacturing integrated circuits, said method comprising the step of applying a quantity of an anti-reflective composition according to claim 33 to the surface of a substrate to form an anti-reflective layer on said substrate surface.

40. The method of claim 39, wherein the molar ratio of m:n is from about 1:9 to about 9:1.

41. The method of claim 39, wherein X' is a light attenuating compound present in said polymer binder at a level of from about 4–50% by weight, based upon the total weight of the polymer binder taken as 100% by weight.

42. The combination of a substrate having a surface and an anti-reflective layer on said substrate surface, said anti-reflective layer including therein a polymer binder comprising recurring monomers according to the formula:

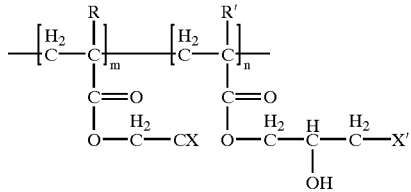

wherein R and R' in each monomer of the polymer binder are individually selected from the group consisting of hydrogen and $C_1$–$C_8$ alkyls, X in each monomer of the polymer binder is individually selected from the group consisting of halogens and hydrogen halides, and X' in each monomer of the polymer binder is individually selected from the group consisting of the hydrogen and light attenuating compounds, said polymer binder comprising from about 20–80% by weight halogen atoms, based upon the total weight of the polymer binder taken as 100% by weight.

43. The combination of claim 42, wherein the molar ratio of m:n is from about 1:9 to about 9:1.

44. The combination of claim 42, wherein X' is a light attenuating compound present in said polymer binder at a level of from about 4–50% by weight, based upon the total weight of the polymer binder taken as 100% by weight.

* * * * *

UNITED STATES PATENT AND TRADEMARK OFFICE
CERTIFICATE OF CORRECTION

PATENT NO. : 6,495,305 B1
DATED : December 17, 2002
INVENTOR(S) : Enomoto et al.

It is certified that error appears in the above-identified patent and that said Letters Patent is hereby corrected as shown below:

Column 17,
Line 32, change "1600°" to read -- 160° --.

Column 19,
Line 34, change "furthering" to read -- further --.

Signed and Sealed this

Twenty-third Day of September, 2003

JAMES E. ROGAN
*Director of the United States Patent and Trademark Office*